United States Patent
Bae (10) Patent No.: US 6,181,635 B1
(45) Date of Patent: Jan. 30, 2001

(54) REDUCED DELAY ADDRESS DECODERS AND DECODING METHODS FOR INTEGRATED CIRCUIT MEMORY DEVICES

(75) Inventor: Yong-cheol Bae, Seoul (KR)

(73) Assignee: Samsung Electronics Co., Ltd. (KR)

(*) Notice: Under 35 U.S.C. 154(b), the term of this patent shall be extended for 0 days.

(21) Appl. No.: 09/185,154

(22) Filed: Nov. 3, 1998

(30) Foreign Application Priority Data

Dec. 27, 1997 (KR) .................................................. 97-74973

(51) Int. Cl.[7] ....................................................... G11C 8/00
(52) U.S. Cl. ................................. 365/230.06; 365/230.08
(58) Field of Search ......................... 365/230.06, 230.08; 362/105, 106

(56) References Cited

U.S. PATENT DOCUMENTS

| 4,731,761 | * | 3/1988 | Kobayashi | 365/230.06 |
| 5,748,557 | * | 5/1998 | Kang | 365/230.08 |
| 5,844,857 | * | 12/1998 | Son et al. | 365/230.06 |
| 5,852,585 | * | 12/1998 | Koshizuka | 365/230.08 |

* cited by examiner

*Primary Examiner*—Son Mai
(74) *Attorney, Agent, or Firm*—Myers Bigel Sibley & Sajovec (57) ABSTRACT

Address decoders receive an address signal and decode the address signal to drive word lines of an integrated circuit memory device. The address decoder includes an address latch that generates an effective address from the address signal. A predecoder generates a predecoded address from the effective address. A main decoder generates from the predetermined address a main address that is applied to the word lines. A first circuit enables the predecoder before the effective address is generated by the address latch. A second circuit may also be provided that resets the effective address after the predecoded address is generated from the effective address. The second circuit may include a circuit that disables the predecoder after the predecoded address is generated from the effective address and a circuit that resets the effective address after the predecoder is disabled.

21 Claims, 8 Drawing Sheets

REDUCED DELAY ADDRESS DECODERS AND DECODING METHODS FOR INTEGRATED CIRCUIT MEMORY DEVICES

FIELD OF THE INVENTION

This invention relates to integrated circuit memory devices, and more particularly to address decoders and decoding methods for integrated circuit memory devices.

BACKGROUND OF THE INVENTION

Integrated circuit memory devices are widely used in consumer and commercial electronics. It is generally desirable to increase the speed of integrated circuit memory devices. Speed may be increased by reducing the delays in read and write operations of the memory devices. For example, the delay in activating a word line in response to address signals may be reduced. This delay may be caused by standby time that is used to activate components after a control signal is applied, transmission delays at each buffer or gate, and precharging times.

Figure 1:
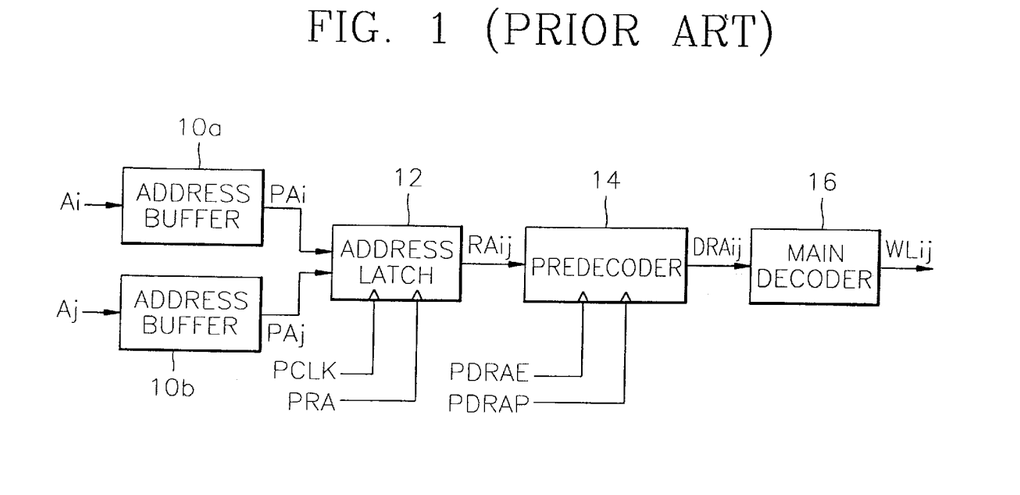
FIG. 1 is a block diagram showing an example of a conventional address decoder.

FIG. 1 is a block diagram of a conventional row address decoder. The delays that are produced in the row address decoder will be described with reference to FIG. 1.

In FIG. 1, address buffers 10a and 10b receive external input signals Ai and Aj of a TTL level and convert the level of the received signals to a CMOS level, to thereby generate the converted signals as address signals PAi and PAj. A row address latch 12 receives the address signals PAi and PAj and latches the received address signals in accordance with an internal clock PCLK and an activation command PRA to generate the latched address signals as effective addresses RAij. A predecoder 14 predecodes the effective addresses RAij and generates predecoded addresses DRAij. A main decoder 16, which may be present for each bank in the memory device, receives the predecoded addresses DRAij, and main-decodes and sufficiently boosts such signal to drive a word line at the boosted voltages WLij.

Figure 2:
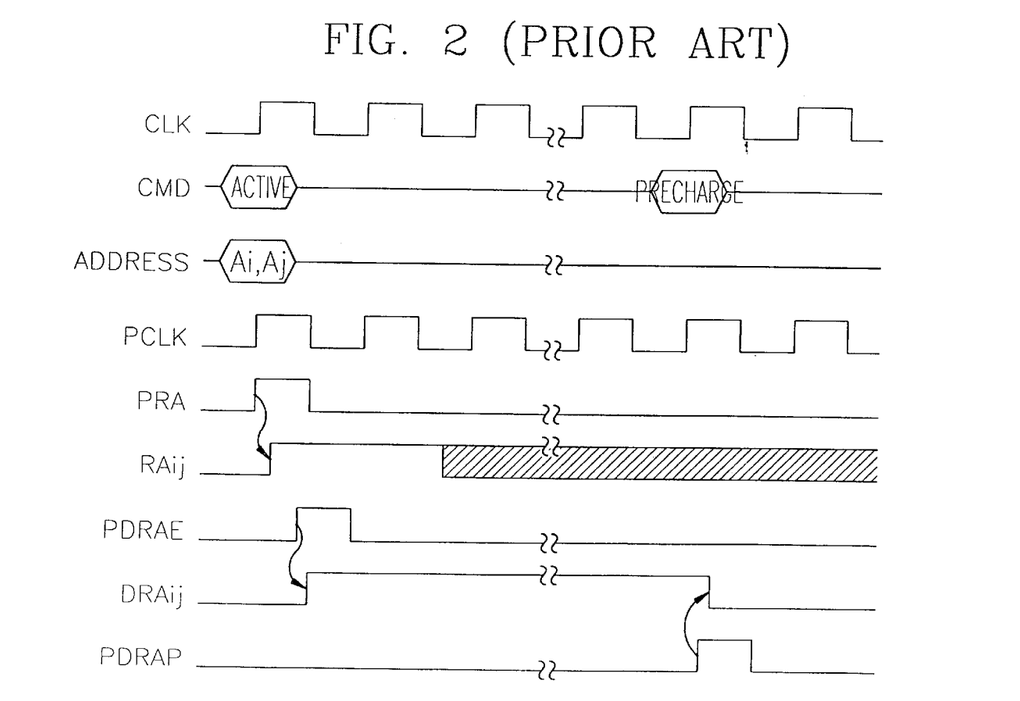
FIG. 2 is a timing diagram of a timing relationship of signals of FIG. 1 during the operation of the address decoder.

FIG. 2 is a timing diagram showing a timing relationship of signals of FIG. 1 during operation of the address decoder.

When a row active command ACTIVE is asserted, the level of the external signals Ai and Aj is shifted to a CMOS level by the address buffers 10a and 10b, and then latched in response to the internal clock PCLK and the activation command PRA. After the latched address signals are output as the effective addresses RAij, the predecoder 14 is enabled in response to an enable signal PDRAE to generate the predecoded addresses DRAij. When a precharge command PRECHARGE is asserted, the decoded addresses DRAij is reset by a predecoder reset signal PDRAP and the decoder returns to a precharge state.

As shown in FIG. 2, even after the decoded addresses DRAij are output, the effective addresses RAij maintains the previous state until a next activation command PRA is input. Accordingly, the predecoder 14 should not be enabled until new effective addresses RAij are generated since the previous effective addresses RAij are applied to the predecoder 14 until the new effective addresses RAij are generated. If the predecoder 14 is enabled before the new effective addresses RAij are generated, the new effective addresses RAij may not be applied to the predecoder 14, so that a wrong word line may be selected.

As described above, since the predecoder 14 should not be enabled until the new effective addresses RAij are generated, there should be a sufficient standby time before the predecoder enable signal PDRAE is asserted to enable the predecoder after the effective addresses RAij are generated. This may be an obstacle in increasing the speed of the memory device.

SUMMARY OF THE INVENTION

It is therefore an object of the present invention to provide improved address decoders and decoding methods for integrated circuit memory devices.

It is another object of the invention to provide address decoders and decoding methods that can reduce the time for enabling the address decoder after an external address is provided.

These and other objects are provided, according to the present invention, by enabling the predecoder before the effective address is generated by the address latch. Accordingly, the predecoder can operate as soon as the effective address is generated by the address latch. The effective address is also preferably reset after the predecoded address is generated from the effective address. The effective address may be reset by disabling the predecoder after the predecoded address is generated from the effective address and resetting the effective address after the predecoder is disabled. Thus, the standby time before the predecoder is enabled after the effective address is generated may be reduced and preferably minimized. Operational speed of the integrated circuit memory device can therefore be increased.

Address decoders according to the invention receive an address signal and decode the address signal to drive word lines of an integrated circuit memory device. The address decoder includes an address latch that generates an effective address from the address signal. A predecoder generates a predecoded address from the effective address. A main decoder generates from the predetermined address a main address that is applied to the word lines. A first circuit enables the predecoder before the effective address is generated by the address latch. A second circuit may also be provided that resets the effective address after the predecoded address is generated from the effective address. The second circuit may include a circuit that disables the predecoder after the predecoded address is generated from the effective address and a circuit that resets the effective address after the predecoder is disabled.

In another embodiment of address decoders according to the invention, an address latch predecoder latches the address signal and generates a predecoded effective address from the latched address signal. A bank enable circuit latches the predecoded effective address to provide a predecoded address. A main decoder generates from the predecoded address a main address that is applied to the word lines. A first circuit enables the bank enable circuit before the effective address is generated by the address latch predecoder. A second circuit may reset the predecoder effective address after the predecoded address is generated from the predecoded effective address. The second circuit may include a circuit that disables the address latch predecoder after the predecoded address is generated from the predecoded effective address and a circuit that resets the predecoded effective address after the address latch predecoder is disabled. Accordingly, reduced delay address decoders and decoding methods may be provided.

BRIEF DESCRIPTION OF THE DRAWINGS

FIG, 4 is a circuit diagram of an address latch of FIG. 3.

DESCRIPTION OF THE PREFERRED EMBODIMENT(S)

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Each embodiment described and illustrated herein includes its complementary conductivity type embodiment as well.

Figure 3:
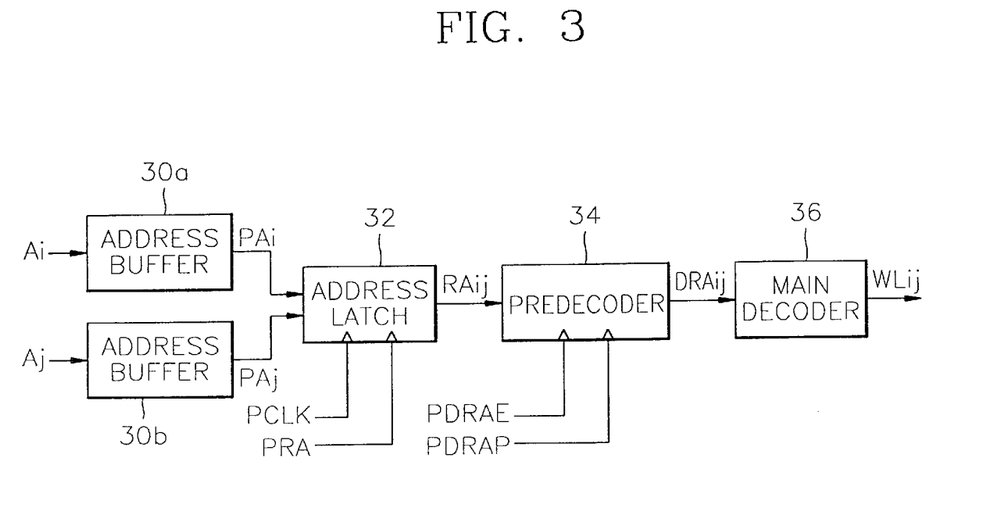
FIG. 3 is a block diagram of an embodiment of address decoders and decoding methods according to the present invention.

Referring to FIG. 3, an address decoder includes address buffers 30a and 30b, an address latch 32, a predecoder 34 and a main decoder 36. The address buffers 30a and 30b receive external input signals Ai and Aj of a TTL level, convert the level of the received signals to a CMOS level, and output the converted signals as address signals PAi and PAj. A differential amplifier type input buffer may be used for the address buffers 30a and 30b, where a logic value of the input signal is determined by being compared to a reference voltage.

The row address latch 32 receives the address signals PAi and PAj, latches the address signals in accordance with an internal clock PCLK and the activation command PRA, and generates the latched address signal as effective addresses RAij. The predecoder 34 predecodes the effective addresses RAij from the row address latch 32 and generates predecoded addresses DRAij. A predecoder 34 may be used for each bank in the memory device. The main decoder 36, one of which may also be used for each bank, receives the decoded addresses DRAij, and main-decodes and sufficiently boosts a voltage to drive a word line at the boosted voltage WLij.

Figure 4:
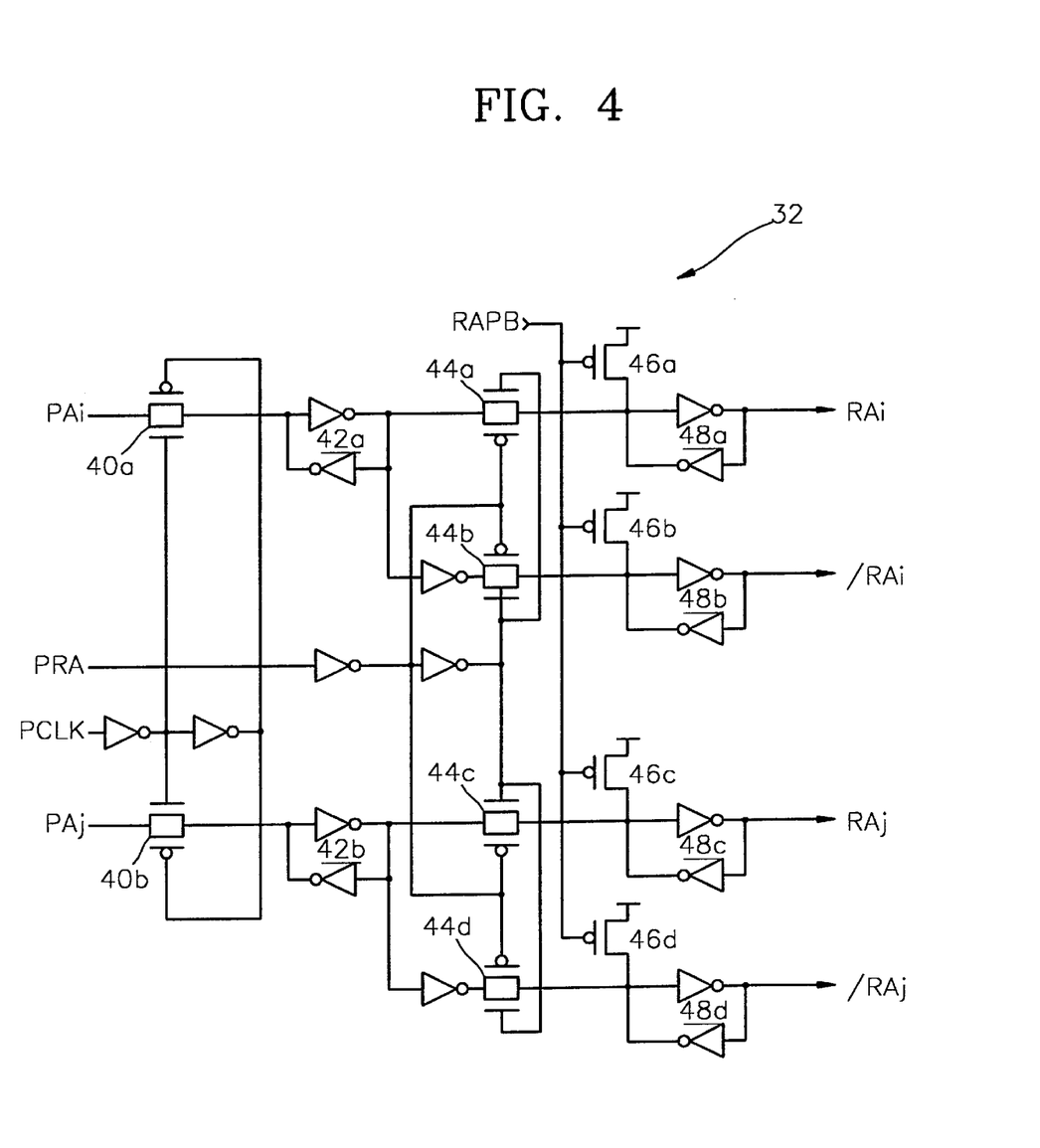

FIG. 4 shows the address latch 32 in detail. Referring to FIG. 4, transmission switches 40a and 40b are turned on in response to the internal clock PCLK, and transmit address signals PAi and PAj to latches 42a and 42b. The latches 42a and 42b store the received address signals PAi and PAj. The transmission switches 44a through 44d are turned on in response to an activation command PRA, and transmit output signals of the latches 42a and 42b and inverted signals thereof to latches 48a through 48d. Each of the latches 48a through 48d latches the received signal and outputs the latched signal as an effective address RAi, /RAi, RAj or /RAj. PMOS transistors 46a through 46d reset nodes A1, A2, A3 and A4 to a "HIGH" level in response to a latch reset signal RAPB. At this time, the effective addresses RAij go "LOW" level.

Figure 5:
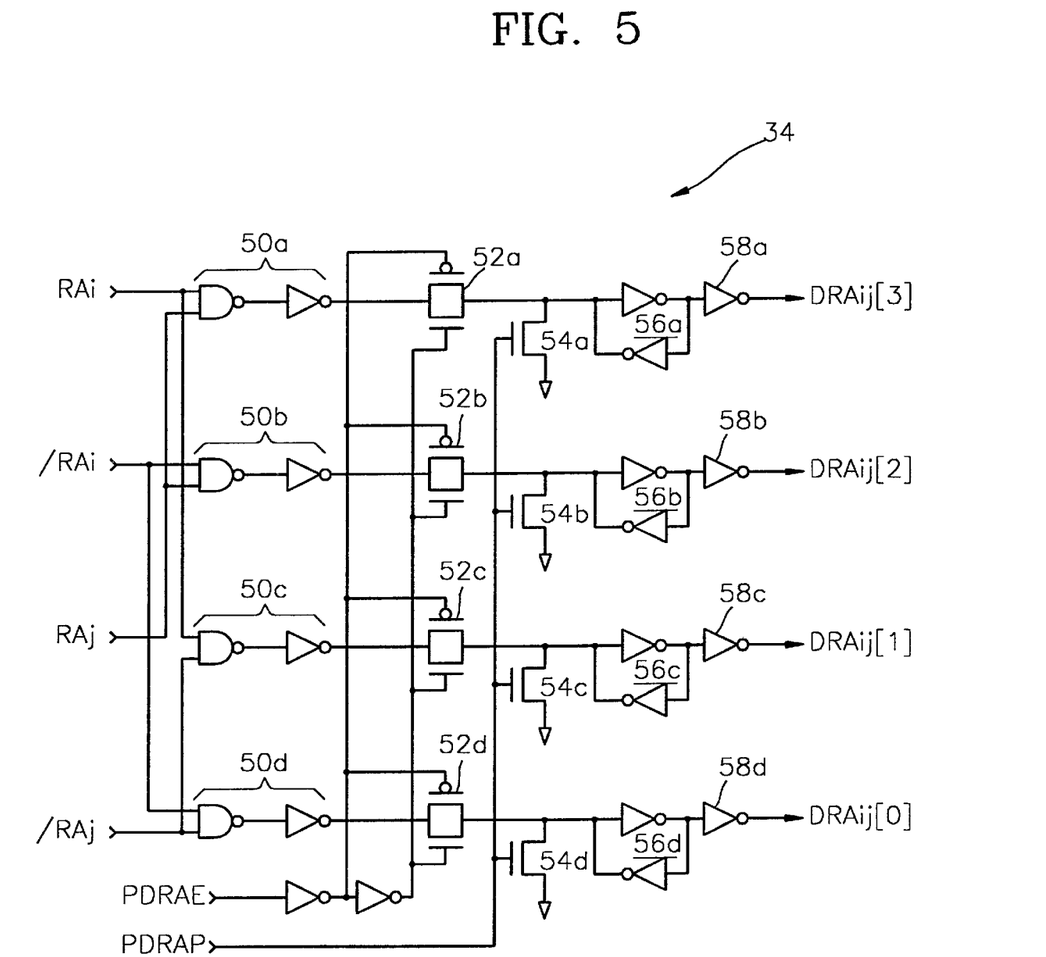
FIG. 5 is a circuit diagram of a predecoder of FIG. 3.

FIG. 5 shows the predecoder 34 of FIG. 3 in detail. Referring to FIG. 5, four predecoding subcircuits 50a through 50d, each of which has a NAND gate and an inverter, perform an AND operation with respect to the received effective addresses RAij. That is, the predecoding subcircuit 50a performs an AND operation with respect to the effective addresses RAi and RAj. The predecoding subcircuit 50b performs an AND operation with respect to the effective addresses RAi and RAj. The predecoding subcircuit 50c performs an AND operation with respect to the effective addresses RAi and /RAj. The predecoding subcircuit 50d performs an AND operation with respect to the effective addresses /RAi and /RAj.

Transmission gates 52a through 52d are turned on in response to a bank enable signal PDRAE and transmit the signals from the predecoded subcircuits 50a through 50d to latches 56a through 56d. NMOS transistors 54a through 54d reset nodes B1, B2, B3 and B4 to a "LOW" level in response to a bank reset signal PDRAP, so that the predecoded address DRAij of "LOW" level are transferred to the main decoder. The latches 56a through 56d latch signals transmitted through the transmission gates 52a through 52d or those reset by the NMOS transistors 54a through 54d. Inverters 58a through 58d restore logic values of data latched by the latches 56a through 56d to output the restored logic values as predecoded addresses DRAij.

Figure 6:
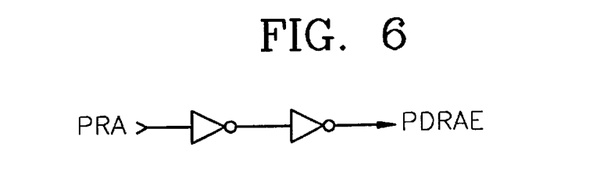
FIG. 6 is a circuit diagram of a circuit for generating a predecoder enable signal of FIG. 3.

FIG. 6 is a circuit diagram of a circuit for generating a predecoder enable signal of FIG. 3. Referring to FIG. 6, a predecoder enable signal PDRAE is generated by delaying the activation command PRA. In the present invention, the predecoder enable signal PDRAE is activated earlier than in a conventional device, to enable the predecoder 34.

Figure 7:
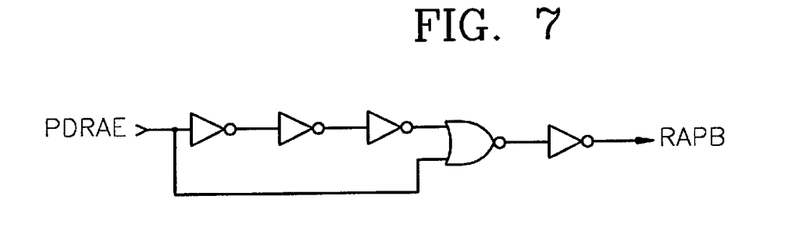
FIG. 7 is a circuit diagram of a circuit for generating the latch reset signal of FIG. 3.

FIG. 7 shows a circuit for generating the latch reset signal of FIG. 3 in detail. Referring to FIG. 7, the latch reset signal RAPB is an pulse signal that is automatically generated by detecting a falling edge of the predecoder enable signal PDRAE, and is an active-low signal having a duration almost the same as that of the activation command PRA and the predecoder enable signal PDRAE. Such a latch reset signal RAPB resets the effective addresses RAij after the effective addresses RAij are generated and latched by the predecoder 34.

Figure 8:
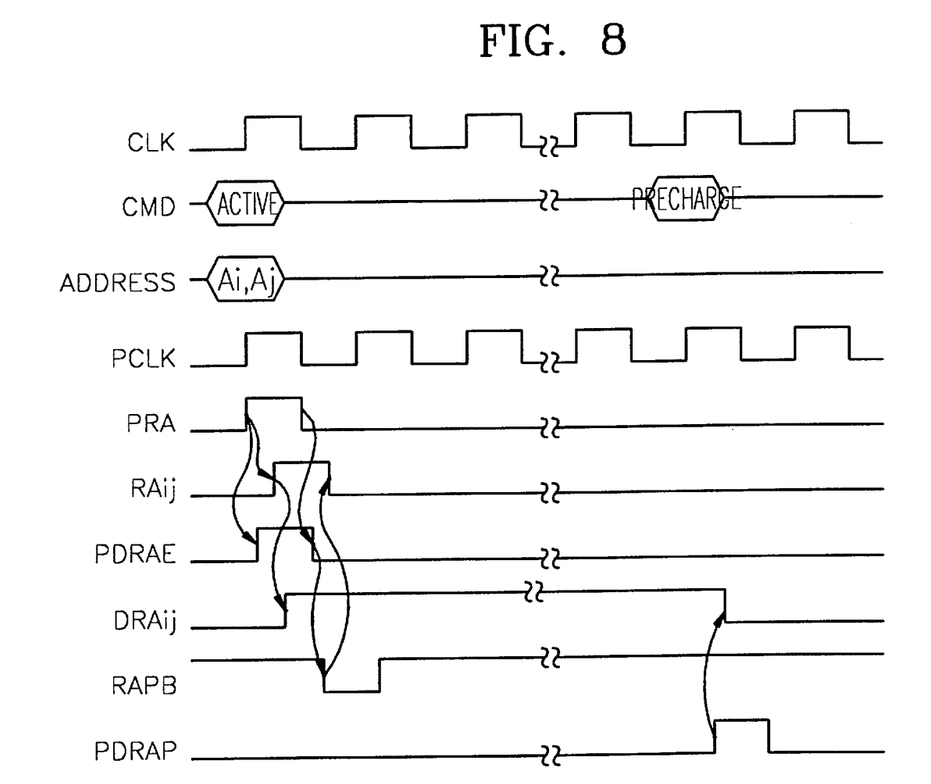
FIG. 8 is a timing diagram of a timing relationship of signals of FIG. 3 during operation of address decoders and decoding methods.

Operation of address decoders of FIG. 3 will now be described in detail with reference to FIG. 8. When the row active command ACTIVE is asserted, external signals Ai and Aj are level-shifted by the address buffers 30a and 30b, and then latched by the address latch 32 in response to the internal clock PCLK and the activation command PRA. The latched address signals are output as the effective addresses Raij.

According to the invention, the time for generating a predecoder enable signal PDRAE is less than the time for generating the effective addresses Raij. Thus, the predecoder 34 is enabled in response to the predecoder enable signal PDRAE before the effective addresses Raij are generated. The predecoder 34 may be enabled before the effective addresses Raij are generated because the previous effective addresses RAij are already reset. Accordingly, the predecoded addresses DRAij are output when a gate delay time of the predecoder 34 is passed after the effective addresses RAij are generated. The predecoder enable signal PDRAE which is a pulse type signal, is deactivated after the generation of the predecoded addresses DRAij.

After the predecoded addresses DRAij are generated, the predecoded enable signal PDRAE is deactivated. The latch reset signal RAPB generation circuit of FIG. 7 activates the latch reset signal RAPB, which is an active-low signal, in response to a falling edge of the predecoder enable signal PDRAE. Then, the effective addresses RAij are reset in response to the latch reset signal RAPB, to thereby prepare for receiving next effective addresses RAij. When a precharge command PRECHARGE is asserted, the predecoder reset signal PDRAP is generated to reset the decoded addresses DRAij, so that the address decoder returns to a precharge state and a word line begins to be disabled.

As described above, the effective addresses RAij are maintained only until the effective addresses RAij are latched by the predecoder. Thus, a row address bus may be shared by more than one bank in a memory device having a plurality of banks in which row addresses are independently latched. Since the reset effective addresses RAij do not produce an output, a decoded address is not generated even though the predecoder 34 is enabled.

Since the predecoder 34 is enabled before the effective addresses RAij are generated, the standby time before the predecoder enable signal PDRAE is asserted to enable the predecoder after the effective addresses RAij are generated may be reduced and preferably minimized, which can increase the operation speed of the memory devices. A falling edge of the enable signal PDRAE as well as a rising edge thereof may be used in the present invention since the predecoder enable signal PDRAE generates the latch reset signal RAPB.

Figure 9:
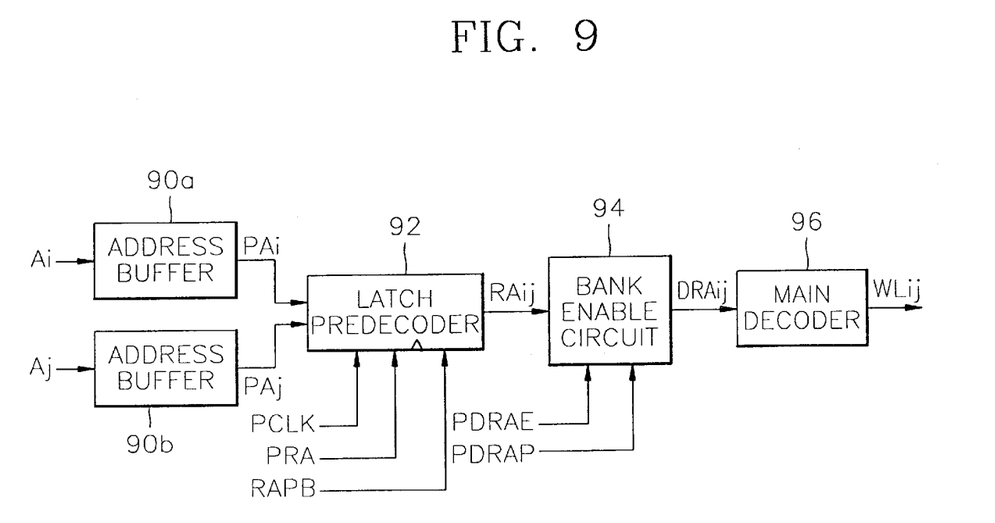
FIG. 9 is a block diagram of another embodiment of address decoders and decoding methods according to the present invention.

FIG. 9 is a block diagram of another embodiment of address decoders according to the present invention. Address decoders of FIG. 9 include address buffers 90a and 90b, an address latch and predecoder 92, a bank enable circuit 94 and a main decoder 96.

Figure 10:
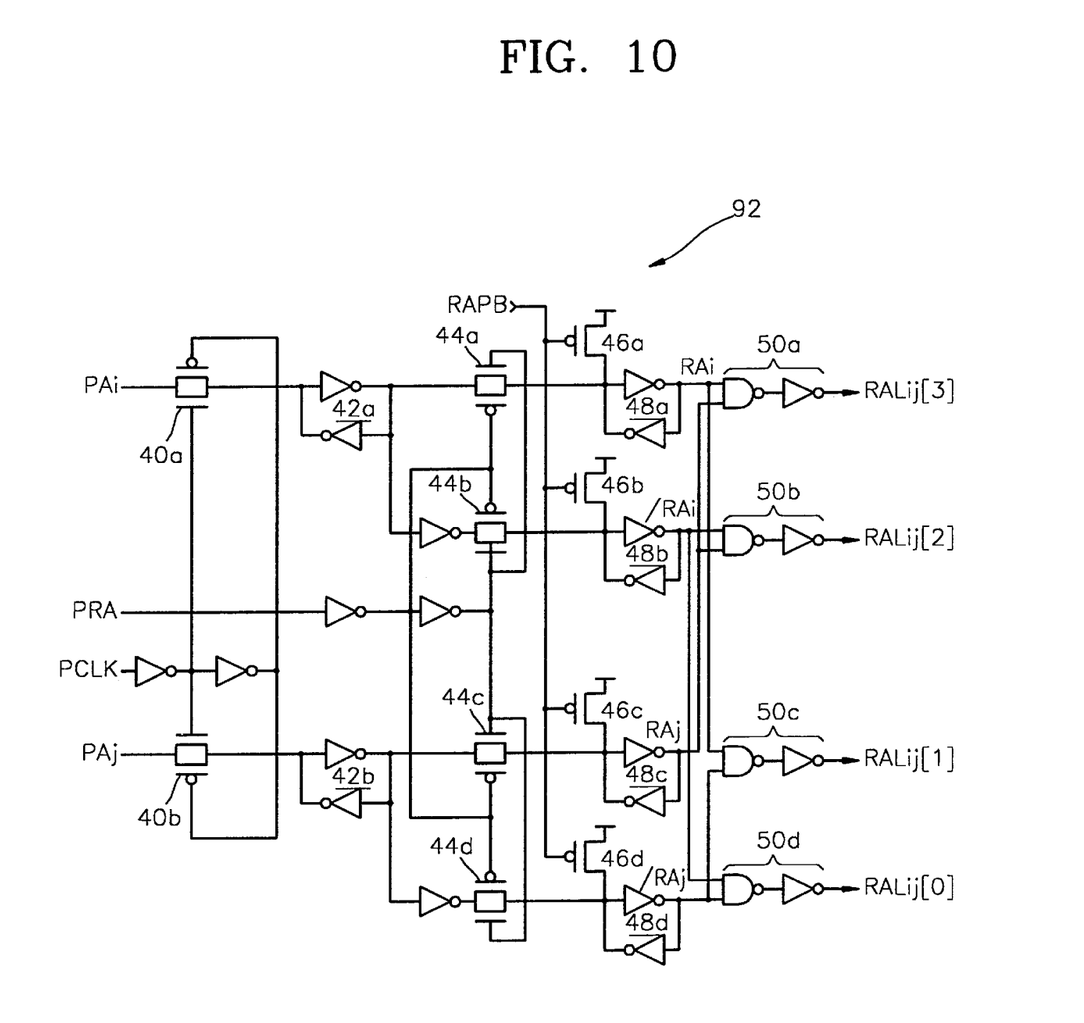
FIG. 10 is a circuit diagram of an address latch and predecoder of FIG. 9.
Figure 11:
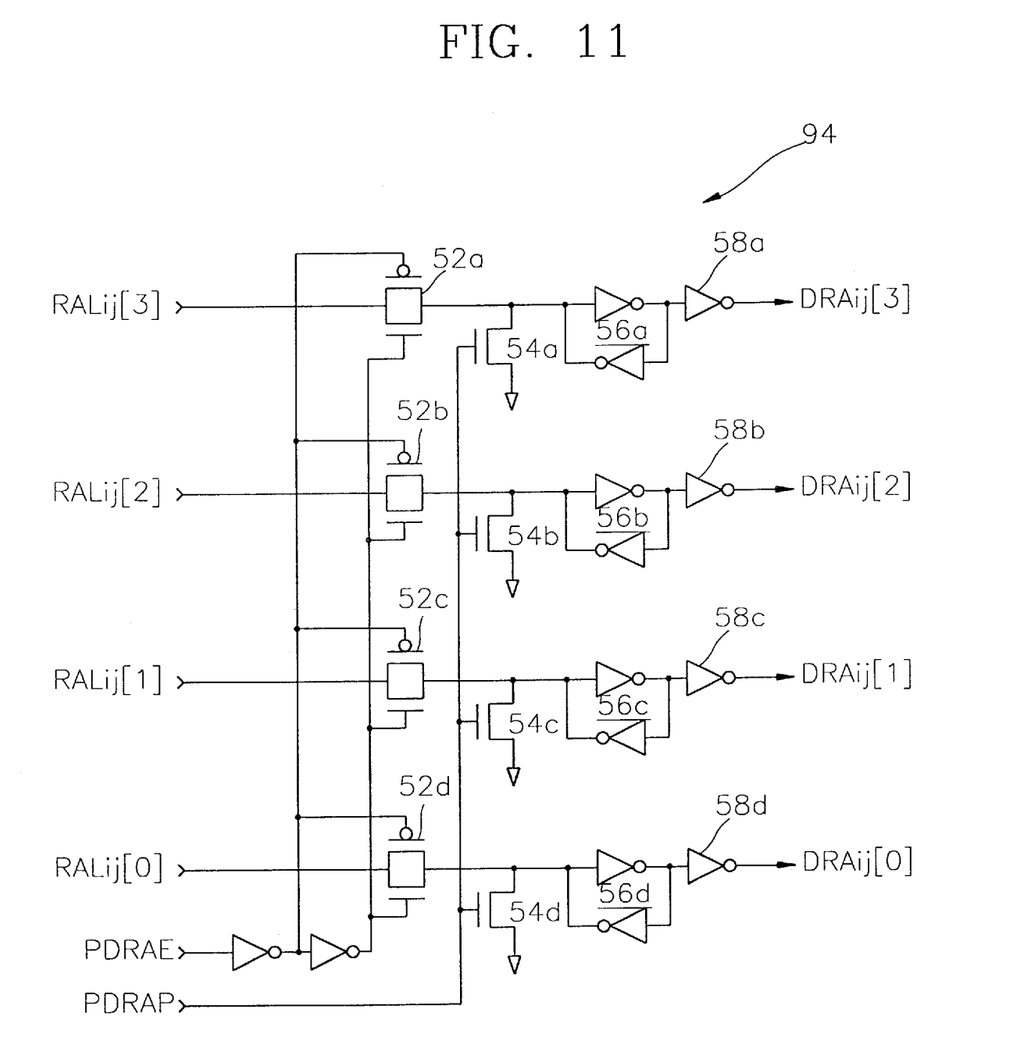
FIG. 11 is a circuit diagram of a bank enable circuit of FIG. 9.

FIGS. 10 and 11 shows the address latch and the predecoder, and the bank enable circuit of FIG. 9, respectively, in detail. Comparing FIGS. 10 and 11 with FIGS. 4 and 5, the predecoder subcircuits 50a through 50d, which are included to the predecoder 34 of FIG. 3, are included to the address latch and predecoder 92 in FIG. 9. Also, all the circuit elements of the predecoder 34 of FIG. 4 except the predecoder subcircuits 50a through 50d, comprises a bank enable circuit 94 in FIG. 9. Therefore, in FIGS. 9 through 11, the same reference numerals will be used to represent the same or similar circuit elements as those in FIGS. 3 through 5.

In FIGS. 9 through 11, each of address buffers 90a and 90b receives input signals Ai and Aj of TTL level, converts the level of such signals to a CMOS level, and outputs the converted signals as address signals PAi and PAj. The row address latch and predecoder 92 receives the address signals PAi and PAj, latches the received address signals in accordance with an internal clock PCLK and an activation command PRA, and predecodes the latched address signals to generate predecoded effective addresses RALij. In the present embodiment, a row address latch and predecoder 92 need not be used for each bank, but may be commonly used by a plurality of banks.

The bank enable circuit 94, one of which may be used for each bank, receives and latches the effective row addresses RALij and provides the latched signals to a main decoder 96 of a corresponding bank as predecoded addresses DRAij.

The main decoder 96 receives the predecoded addresses DRAij. The main decoder 96 main-decodes and sufficiently boosts the received signal to drive a word line at the boosted voltage WLij.

As described above, the predecoder subcircuits 50a through 50d are included in the address latch and predecoder 92 in the present embodiment. However, the operation of the address decoder of FIG. 9 is similar to that of FIG. 3. Thus, the detailed description thereof need not be repeated.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of operating an address decoder of an integrated circuit memory device, the address decoder comprising an address latch that generates an effective address from an address signal, a predecoder that generates a predecoded address from the effective address and a main decoder that generates from the predecoded address a main address that is applied to word lines of the memory device, the method comprising the step of:
    enabling the predecoder before the effective address is generated by the address latch.

2. A method according to claim 1 wherein the enabling step is followed by the step of:
    resetting the effective address after the predecoded address is generated from the effective address.

3. A method according to claim 2 wherein the resetting step comprises the steps of:
    disabling the predecoder after the predecoded address is generated from the effective address; and
    resetting the effective address after the predecoder is disabled.

4. A method according to claim 1 wherein the enabling step comprises the step of:
    enabling the predecoder a predetermined time after enabling the address latch.

5. An address decoder for an integrated circuit memory device that receives an address signal and decodes the address signal to drive word lines, the address decoder comprising:
    an address latch that generates an effective address from the address signal;
    a predecoder that generates a predecoded address from the effective address;
    a main decoder that generates from the predecoded address a main address that is applied to the word lines; and
    a circuit that enables the predecoder before the effective address is generated by the address latch.

6. An address decoder according to claim 5 further comprising:
    a second circuit that resets the effective address after the predecoded address is generated from the effective address.

7. An address decoder according to claim 6 wherein the second circuit comprises:
    a circuit that disables the predecoder after the predecoded address is generated from the effective address; and
    a circuit that resets the effective address after the predecoder is disabled.

8. An address decoder according to claim 5 wherein the circuit comprises:

a delay circuit that enables the predecoder a predetermined time after enabling the address latch.

9. An address decoder for an integrated circuit memory device that receives an address signal and decodes the address signal to drive word lines, the address decoder comprising:

first means for generating an effective address from the address signal;

second means for generating a predecoded address from the effective address;

third means for generating from the predecoded address a main address that is applied to the word lines; and means for enabling the second means before the effective address is generated by the first means.

10. An address decoder according to claim 9 further comprising:

means for resetting the effective address after the predecoded address is generated from the effective address by the second means.

11. An address decoder according to claim 10 wherein the resetting means comprises:

means for disabling the second means after the predecoded address is generated from the effective address; and means for resetting the effective address after the second means is disabled.

12. An address decoder according to claim 9 wherein the means for enabling comprises:

means for enabling the second means a predetermined time after enabling the first means.

13. A method of operating an address decoder of an integrated circuit memory device, the address decoder comprising an address latch predecoder that latches an address signal and generates a predecoded effective address from the latched address signal, a bank enable circuit that latches the predecoded effective address to provide a predecoded address and a main decoder that generates from the predecoded address a main address that is applied to word lines of the memory device, the method comprising the step of:

enabling the bank enable circuit before the predecoded effective address is generated by the address latch predecoder.

14. A method according to claim 13 wherein the enabling step is followed by the step of:

resetting the predecoded effective address after the predecoded address is generated from the predecoded effective address.

15. A method according to claim 14 wherein the resetting step comprises the steps of:

disabling the address latch predecoder after the predecoded address is generated from the predecoded effective address; and resetting the predecoded effective address after the address latch predecoder is disabled.

16. An address decoder for an integrated circuit memory device that receives an address signal and decodes the address signal to drive word lines, the address decoder comprising:

an address latch predecoder that latches the address signal and generates a predecoded effective address from the latched address signal;

a bank enable circuit that latches the predecoded effective address to provide a predecoded address;

a main decoder that generates from the predecoded address a main address that is applied to the word lines; and a circuit that enables the bank enable circuit before the predecoded effective address is generated by the address latch predecoder.

17. An address decoder according to claim 16 further comprising:

a second circuit that resets the predecoded effective address after the predecoded address is generated from the predecoded effective address.

18. An address decoder according to claim 17 wherein the second circuit comprises:

a circuit that disables the address latch predecoder after the predecoded address is generated from the predecoded effective address; and a circuit that resets the predecoded effective address after the address latch predecoder is disabled.

19. An address decoder for an integrated circuit memory device that receives an address signal and decodes the address signal to drive word lines, the address decoder comprising:

first means for latching the address signal and for generating a predecoded effective address from the latched address signal;

second means for latching the predecoded effective address to provide a predecoded address;

third means for generating from the predecoded address a main address that is applied to the word lines; and means for enabling the second means before the predecoded effective address is generated by the first means.

20. An address decoder according to claim 19 further comprising:

means for resetting the predecoded effective address after the predecoded address is generated from the predecoded effective address by the second means.

21. An address decoder according to claim 20 wherein the resetting means comprises:

means for disabling the first means after the predecoded address is generated from the predecoded effective address; and means for resetting the predecoded effective address after the first means is disabled.

* * * * *